United States Patent
Kuntz et al.

(10) Patent No.: US 9,478,589 B2
(45) Date of Patent: Oct. 25, 2016

(54) ELECTRONIC APPARATUS HAVING AN OXYGEN ION PUMP

(71) Applicant: Merck Patent GmbH, Darmstadt (DE)

(72) Inventors: Matthias Kuntz, Seeheim-Jugenheim (DE); Junyou Pan, Frankfurt am Main (DE); Volker Hilarius, Gross-Umstadt (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 14/649,586

(22) PCT Filed: Nov. 7, 2013

(86) PCT No.: PCT/EP2013/003360
§ 371 (c)(1),
(2) Date: Jun. 4, 2015

(87) PCT Pub. No.: WO2014/086454
PCT Pub. Date: Jun. 12, 2014

(65) Prior Publication Data
US 2015/0349035 A1 Dec. 3, 2015

(30) Foreign Application Priority Data
Dec. 5, 2012 (EP) .................... 12008149

(51) Int. Cl.
*H01J 7/16* (2006.01)
*H01L 27/32* (2006.01)
*H01L 51/52* (2006.01)
*H01J 41/12* (2006.01)

(52) U.S. Cl.
CPC .......... *H01L 27/3225* (2013.01); *H01J 41/12* (2013.01); *H01L 51/52* (2013.01); *H01L 51/524* (2013.01); *H01L 51/5237* (2013.01); *H01L 51/5246* (2013.01)

(58) Field of Classification Search
CPC .......... H01L 27/3225; H01L 51/5237; H01L 51/524; H01L 51/5246; H01L 51/52; H01J 41/12
See application file for complete search history.

(56) References Cited

U.S. PATENT DOCUMENTS

| 6,083,459 | A | 7/2000 | Mukai et al. |
| 2008/0035492 | A1* | 2/2008 | Hilliard ................ B01D 53/326 205/688 |
| 2008/0106191 | A1 | 5/2008 | Kawase |
| 2011/0260607 | A1* | 10/2011 | Liu ....................... H01L 51/525 313/512 |

FOREIGN PATENT DOCUMENTS

EP   1267385 A1   12/2002

OTHER PUBLICATIONS

Garcia-Barriocanal, J., et al., "Colossal Ionic Conductivity at Interfaces of Epitaxial ZrO2:Y2O3/SrTiO3 Heterostructures", Science, American Association for the Advancement of Science, vol. 321, (2008), pp. 676-680.
International Search Report for PCT/EP2013/003360 mailed May 8, 2014.

* cited by examiner

*Primary Examiner* — Donald Raleigh
(74) *Attorney, Agent, or Firm* — Drinker Biddle & Reath LLP

(57) ABSTRACT

The present invention relates to an electronic apparatus which contains an electronically active material and an oxygen ion pump for removing oxygen from the apparatus. Furthermore, the present invention also relates to the use of an oxygen ion pump for removing oxygen from an electronic apparatus.

12 Claims, 3 Drawing Sheets

ELECTRONIC APPARATUS HAVING AN OXYGEN ION PUMP

CROSS-REFERENCE TO RELATED APPLICATIONS

This application is a national stage application (under 35 U.S.C. §371) of PCT/EP2013/003360, filed Nov. 7, 2013, which claims benefit of European Application No. 12008149.2, filed Dec. 5, 2012, both of which are incorporated herein by reference in their entirety.

The present invention relates to an electronic device which comprises an electronically active material and an oxygen ion pump for the removal of oxygen from the device. Furthermore, the present invention also relates to the use of an oxygen ion pump for the removal of oxygen from an electronic device.

There are today many different electronically active materials which are suitable, for example, for the production of lamps, display devices, solar cells or field-effect transistors. These materials are employed, in particular, in so-called organic light-emitting diodes and in organic solar cells. However, many of these electronically active materials have the disadvantage that they are sensitive to the ambient climate, in particular to oxygen, water vapour, water and ozone. It is therefore necessary to seal such materials adequately in electronic devices.

Thus, for example in the case of a display device based on organic light-emitting diodes, organic compounds are embedded between glass plates which are sealed at the edge. For this purpose, organic adhesives are usually employed, but these cannot completely prevent diffusion of oxygen. Thus, slow degeneration of the organic compounds and fading of the colours in such display devices occur on progression of the operating time. FIG. 1 shows diagrammatically an electronic device of this type. In the prior art, so-called sacrificial materials (gatters) which are intended to scavenge the ingressing oxygen are installed inside the seal for adsorption. A further possibility for preventing the ingress of oxygen is sealing with glass solder. The second variant in particular is problematic since high temperatures are necessary for sealing with glass solder and many electronically active materials, in particular organic electronic materials, only have limited temperature stability.

The circumstance of prevention of the ingress of oxygen into an electronic device of this type is of enormous importance since plastics by means of which the cells are sealed are not impermeable to oxygen diffusion. If instead of glass plates—as will probably play an ever greater role in future—transparent polymer films are used, these are likewise not impermeable to oxygen diffusion. In each of the cases mentioned, the ingressing oxygen will little by little destroy the functioning ability of the electronically active material. This is evident, in particular, from the colours, for example in display devices, fading little by little. Although this can partially be countered using intelligent electronics, it is nevertheless desirable that this damage does not occur.

The object of the present invention was therefore to provide an electronic device in the case of which oxygen ingressing little by little can be constantly removed from the device again, so that the lifetime of such devices is increased.

The object of the present invention is achieved by the provision of an electronic device which comprises at least one electronically active material, a covering which encloses the electronically active material in its interior, and an oxygen ion pump, where the oxygen ion pump is either an integral constituent of the covering or is installed on the inside surface of the covering, and where the oxygen ion pump comprises a cathode and an anode at two opposite ends of an oxygen ion-conducting material, where at least part of the cathode is directed towards the inside of the covering and at least part of the anode is directed towards the outside of the covering.

The expression "at least part of the cathode directed towards the inside of the covering" is intended to be taken to mean that the cathode is at least partly located in the interior of the covering, i.e. the space which is delimited by the covering. The expression "at least part of the anode directed towards the outside of the covering" is intended to be taken to mean that the anode is located on the space opposite the inside of the covering, preferably the space outside the covering, i.e. the anode is located further away from the centre of the covering than the cathode. Only in this way can it be ensured that, on application of a voltage to anode and cathode, oxygen are transported from the inside of the covering to the outside through the oxygen ion-conducting material lying in between.

In a further embodiment of the electronic device according to the invention, the comprises a substrate, a sealing cap and an adhesive, where the adhesive preferably seals the substrate and the sealing cap to one another. Such an embodiment according to the invention is shown in FIG. 2 of the present application.

In a further embodiment of the electronic device according to the invention, it is preferred that the oxygen ion pump is arranged in the region of the adhesive. It is particularly preferred here that the oxygen ion-conducting material has contact with the interior of the covering on the side of the cathode and has contact with the outer surroundings of the covering with the side facing the anode, where the oxygen ion pump is preferably embedded in the adhesive. An embodiment of this type is also revealed, for example, by FIG. 2. Oxygen ion pumps which can be integrated into the adhesive region of a device according to the invention are shown by way of example in FIG. 3.

In a further embodiment of the electronic device according to the invention, it is preferred that the oxygen ion pump is arranged as a layer at least in regions on the substrate and/or the sealing cap. "at least in regions" means that at least part of the surface of the substrate and/or of the sealing cap is provided with preferably a layer of the oxygen ion pump. Alternatively, however, the entire surface of the substrate and/or of the sealing cap may also be provided with a layer of the oxygen ion pump.

A layer of the oxygen ion pump is taken to mean a layer which is built up from at least three sub-layers, where one of the sub-layers represents a layer of the cathode, a further of the sub-layers represents a layer of the anode and still a further of the sub-layers represents the layer of the oxygen ion-transporting material. Here too, the oxygen ion-conducting layer is located between the layers of the anode and of the cathode. In this embodiment, the cathode is preferably located on the inside surface of the covering, i.e. of the substrate and/or of the sealing cap, and the cathode is oriented towards the interior of the covering.

Very generally, the "inside of the covering" in this application is taken to mean the interior of the electronic device according to the invention which is enclosed by the covering. The term "outside of the covering" in this application is generally taken to mean the space outside the covering which is not enclosed thereby.

In the embodiment of the present invention in which the oxygen ion pump is arranged as a layer at least in regions on the substrate and/or the sealing cap, it is preferred that at least a region of the substrate and/or of the sealing cap on which the oxygen ion pump is installed is oxygen-permeable towards the outside of the covering. This can be ensured, for example, by using an oxygen-permeable material, such as, for example, a polymer layer, as covering, or by the material of the covering having openings.

In the present application, the substrate preferably consists of glass, ceramic, metal, a polymer layer or a plastic layer, where a flexible substrates is preferred. In a preferred embodiment, the flexible substrates consists of polymer or plastic. The most important selection criteria for polymers or plastics are 1) hygienic aspects and 2) glass transition temperature. The glass transition temperature (Tg) of the polymers can be obtained from known handbooks (for example "Polymer Handbook", Eds. J. Brandrup, E H Immergut and EA Grulke, John Willey & Sons, Inc., 1999, VI/193-VI/276). Tg of the polymer is preferably above 100° C., very preferably above 150° C. and very particularly preferably above 180° C. Very preferred substrates are, for example, poly (ethylene terephthalate) (PET) and poly (ethylene 2,6-naphthalate) (PEN).

The sealing cap in the present application preferably consists of glass, ceramic, metal, a polymer layer or a plastic layer. Glass and metal are particularly preferred.

A ceramic used as substrate or sealing cap can be one of the following: silicate glass, carbides (SiC), metal oxides ($Al_2O_3$), nitrides ($Si_3N_4$) and other non-silicate glasses In the present invention, the oxygen ion-conducting material is preferably a solid-state electrolyte. The solid-state electrolyte to be used in accordance with the invention is capable of transporting $O^{2-}$ ions formed from oxygen at the cathode, which are converted back into oxygen therefrom on the opposite side to the cathode, i.e. at the anode. In principle, a solid-state electrolyte which can typically be used in solid oxide fuel cells can also be used in devices according to the invention. Suitable materials for solid-state electrolytes are, for example, zirconium dioxide, bismuth oxide, thorium oxide, hafnium oxide, apatites, cerium oxide, lanthanum molybdates, lanthanoid oxyfluorides, lanthanum oxides and combinations thereof. In an embodiment, the solid-state electrolyte is doped or stabilised by, preferably, metals of the rare earths or lanthanoids. Reviews of solid-state electrolyte are given, for example, in Adachi et al., Chem. Rev. 2002, 102, 2405-2429; Kendrick et al., Annu. Rep. Prog. Chem., Sect. A, 2009, 105, 436-459; Malavasi et al., Chem. Soc. Rev., 2010, 39, 4370-4387. The solid-state electrolyte is particularly preferably selected from the group consisting of yttrium-stabilised zirconium oxide, ytterbium-stabilised zirconium oxide, calcium-stabilised zirconium oxide, cerium-stabilised zirconium oxide, ytterbium-stabilised zirconium oxide, scandium-stabilised zirconium oxide, titanium oxide, tin oxide, zinc oxide and combinations thereof.

In a very preferred embodiment, the oxygen ion pump comprises an oxygen ion-conducting layer which has a multilayered structure, such as, for example, a superlattice, as reported by J. Garcia-Barriocanal, et al. in Science 321, 676 (2008).

The cathode of the oxygen ion pump, preferably comprises a material catalyses the oxygen reduction reaction. The cathode material preferably consists of noble metal particularly preferably Pt, Pd. The cathode is preferably gas-permeable, such as, for example, in the form of a metal mesh.

The anode of the oxygen ion pump is preferably a material which is selected from the group consisting of metal, conductive metal oxide and conductive polymers. The anode preferably consists of one or more of these materials.

The electronically active material is preferably an oxygen-sensitive material. An oxygen-sensitive material is taken to mean that it is irreversibly damaged in its electronic properties by the presence of oxygen. The electronically active material can be an organic electronic material or a material which contains at least one quantum dot. However, the electronically active material is preferably an organic electronic material.

The organic-electronic material can be a light-emitting material, a hole-transport material (HTM), a hole-injection material (HIM), an electron-transport material (ETM), an electron-injection material (EIM), a hole-blocking material (HBM), an electron-blocking material (EBM), an exciton-blocking material (ExBM), a host material, an organic metal complex, an organic dye or a combination thereof.

A light-emitting material is a material which preferably emits light in the visible region. The light-emitting material preferably has an emission maximum between 380 nm and 750 nm. The light-emitting material is preferably a phosphorescent or fluorescent emitter compound.

A fluorescent emitter compound in the sense of this invention is a compound which exhibits luminescence from an excited singlet state at room temperature. For the purposes of this invention, in particular all luminescent compounds which contain no heavy atoms, i.e. no atoms having an atomic number greater than 36, are to be regarded as fluorescent compounds.

The light-emitting materials employed are particularly preferably phosphorescent emitter compounds. A phosphorescent emitter compound is generally taken to mean a compound which exhibits luminescence from an excited state having relatively high spin multiplicity, i.e. a spin state >1, such as, for example, from an excited triplet state (triplet emitter), from an MLCT mixed state or a quintet state (quintet emitter). Suitable phosphorescent emitter compounds are, in particular, compounds which emit light, preferably in the visible region, on suitable excitation and in addition contain at least one atom having atomic numbers >38 and <84, particularly preferably >56 and <80. Preferred phosphorescence emitters are compounds which contain copper, molybdenum, tungsten, rhenium, ruthenium, osmium, rhodium, iridium, palladium, platinum, silver, gold or europium, in particular compounds which contain iridium, platinum or copper. Examples of the emitters described above are revealed by the applications WO 00/70655, WO 01/41512, WO 02/02714, WO 02/15645, EP 1191613, EP 1191612, EP 1191614, WO 2005/033244. In general, all phosphorescent complexes as are used in accordance with the prior art for phosphorescent OLEDs and as are known to the person skilled in the art in the area of organic electroluminescence are suitable.

HTMs or HIMs are materials which have hole-transporting or hole-injecting properties. Examples of such materials are: triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocyclic compounds having a high HOMO (HOMO=highest occupied molecular orbital). These arylamines and heterocyclic compounds preferably result in an HOMO in the polymer of more than −5.8 eV (vs. vacuum level), particularly preferably of more than −5.5 eV.

ETMs and EIMs are materials which have electron-transporting or electron-injecting properties. Examples of such materials are: pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocyclic compounds having a low LUMO (LUMO=lowest unoccupied molecular orbital). These units in the polymer preferably result in an LUMO of less than −2.5 eV (vs. vacuum level), particularly preferably of less than −2.7 eV.

HBMs are materials which block the formation of holes or suppress their transport. HBMs are frequently inserted between the light-emitting layer and the electron-transport layer in devices comprising phosphorescent emitters.

Suitable HBMs are metal complexes, such as, for example, BAlQ (=bis(2-methyl-8-quinolinolato)(4-phenyl-phenolato)aluminium(III)). Irppz (Ir(ppz)$_3$=fac-tris(1-phenylpyrazolato-N,C$^2$)iridium(III)) is likewise used for this purpose. Phenanthroline derivatives, such as, for example, BCP (=2,9-dimethyl-4,7-diphenyl-1,10-phenanthroline, =bathocuproin), or phthalimides, such as, for example, TMPP (=2,3,5,6-tetramethylphenyl-1,4-(bisphthalimide)), are likewise advantageously employed. Suitable HBMs are furthermore described in WO 00/70655 A2, WO 01/41512 and WO 01/93642 A1. Also suitable are triazine derivatives, spirooligophenylenes and ketones or phosphine oxides.

EBMs are materials which suppress or block the transport of electrons. ExBMs are likewise materials which suppress or block the transport or formation of excitons. EBMs and ExBMs advantageously employed are transition-metal complexes, such as, for example, Ir(ppz)$_3$ (US 2003-0175553) and AlQ$_3$. Likewise suitable are arylamines, in particular triarylamines (for example described in US 2007-0134514 A1) and substituted triarylamines (for example MTDATA or TDATA (=4,4',4"-tris(N,N-diphenylamino)triphenylamine)), N-substituted carbazole compounds (for example TCTA), heterocyclic compounds (for example BCP) or tetraazasilane derivatives.

A host material is preferably a material which is employed as matrix for a light-emitting compound. Suitable host materials for fluorescent emitters are materials from various classes of substance. Preferred host materials are selected from the classes of the oligoarylenes (for example 2,2',7,7'-tetraphenylspirobifluorene or dinaphthylanthracene), in particular the oligoarylenes containing condensed aromatic groups, such as, for example, anthracene, benzanthracene, benzophenanthrene, phenanthrene, tetracene, coronene, chrysene, fluorene, spirofluorene, perylene, phthaloperylene, naphthaloperyleve, decacyclene, rubrene, the oligoarylenevinylenes (for example DPVBi=4,4'-bis(2,2-diphenylethenyl)-1,1'-biphenyl) or spiro-DPVBi in accordance with EP 676461), the polypodal metal complexes, in particular metal complexes of 8-hydroxyquinoline, for example AlQ$_3$ (=aluminium(III) tris(8-hydroxyquinoline)) or bis(2-methyl-8-quinolinolato)-4-(phenylphenolinolato)aluminium, also with imidazole chelate and the quinoline-metal complexes, aminoquinoline-metal complexes, benzoquinoline-metal complexes, the hole-conducting compounds, the electron-conducting compounds, in particular ketones, phosphine oxides, sulfoxides, etc., the atropisomers, the boronic acid derivatives or the benz-anthracenes.

Organic metal complexes are taken to mean metal-ligand coordination compounds in which the ligand is an organic compound. In accordance with the invention, the metal complexes include all compounds which can be employed in organic electronic devices by a person skilled in the art in this area.

"Dyes" are taken to mean compounds which absorb a limited part of visible white light and reflect the unabsorbed part of white light. The complementary colour of the perceived light is absorbed by the dye. The colour absorption in dyes is usually based on many conjugated double bonds and aromatic skeletons. On absorption, the conjugated electrons in the double-bond system are raised to a higher energy state and the dye molecule releases the energy again by radiation in a different wavelength (or by emission of heat).

"Quantum dot" (QDs) in the present invention is taken to mean a nanoscopic structure comprising a semiconductor material, such as, for example, InGaAs, CdSi, ZnO or also GaInP/InP. Quantum dots are characterised in that the charge carriers (electrons, holes) in a quantum dot are so restricted in their mobility in all three spatial directions that their energy can no longer adopt continuous values, but instead only discrete values. Quantum dots thus behave in a similar way to atoms, but can be influenced in their shape, size or the number of electrons in them. Their inherent atomic size order is typically about $10^4$ atoms.

The QDs of the present invention relate, in particular, to semiconductor nanocrystal colloids, also known as colloidal quantum dots or nanodots or nanocrystals, which are produced by chemical processes.

Suitable semiconductor materials which can be integrated into QDs are selected, from the elements from group II-VI, such as CdSe, CdS, CdTe, ZnSe, ZnO, ZnS, ZnTe, HgS, HgSe, HgTe and alloys thereof, such as, for example, CdZnSe; group III-V, such as InAs, InP, GaAs, GaP, InN, GaN, InSb, GaSb, AlP, AlAs, AlSb and alloys, such as InAsP, CdSeTe, ZnCdSe, InGaAs, group IV-VI, such as PbSe, PbTe and PbS and alloys thereof; group such as InSe, InTe, InS, GaSe and alloys, such as InGaSe, InSeS; group IV semiconductors, such as Si and Ge alloys thereof, and combinations thereof in composite structures.

In a particularly preferred embodiment, the QDs in accordance with the present invention comprises semiconducting materials which are selected from group II-VI semiconductors, alloys thereof and core/shell structures thereof. In further embodiments, the QDs of the invention comprise the group II-VI semiconductors CdSe, CdS, CdTe, ZnSe, ZnS, ZnTe, alloys thereof, combinations thereof and core/shell, core/multishell shell structures thereof.

In the electronic device according to the invention, the organic electronic material is preferably a light-emitting material.

The oxygen ion pump used in the electronic device insists on the principle that certain materials are capable of transporting $O^{2-}$ on application of a voltage.

The present invention makes use here, in particular, of the inverse principle of a lambda probe (in particular Nernst probe), in which an oxygen ion-conducting material reacts to the different oxygen partial pressure on two opposite sides, on each of which an electrode are installed. In the case of a different partial pressure, a flow of oxygen ions through the material can occur, where a voltage can be measured at the electrodes. In the present application, application of a voltage to cathode and anode as it were forces the material to transport oxygen ions in the desired direction. Depending on the type of oxygen ion-conducting material used, a voltage in the range from 2 V to 35 V must be applied for this purpose.

A further embodiment of the present invention relates to the use of an oxygen ion pump for the removal of oxygen from an electronic device. In other words, the present invention also relates to a process for the removal of oxygen from an electronic device using an oxygen ion pump, as described above.

The electronic device according to the invention or the electronic device mentioned in the use according to the invention is preferably selected from the group consisting of organic or polymeric organic electroluminescent devices (OLED, PLED), organic field-effect transistors (OFETs), organic integrated circuits (OICs), organic thin-film transistors (OTFTs), organic light-emitting transistors (OLETs), organic solar cells (OSCs), organic optical detectors, organic laser diodes (O-lasers), organic field-quench devices (OFQDs), light-emitting electrochemical cells (LECs), "organic plasmon emitting devices" and organic photovoltaic (OPV) elements or devices, and organic photoreceptors (OPCs).

It should be pointed out that variations of the embodiments described in the present invention fall within the scope of this invention. Each feature disclosed in the present invention can, unless this is explicitly excluded, be replaced by alternative features which serve the same, an equivalent or a similar purpose. Thus, each feature disclosed in the present invention is, unless stated otherwise, to be regarded as an example of a generic series or as an equivalent or similar feature.

All features of the present invention can be combined with one another in any way, unless certain features and/or steps are mutually exclusive. This applies, in particular, to preferred features of the present invention. Equally, features of non-essential combinations can be used separately (and not in combination).

It should furthermore be pointed out that many of the features, and in particular those of the preferred embodiments of the present invention, are themselves inventive and are not merely to be regarded as part of the embodiments of the present invention. For these features, independent protection may be sought additionally or alternatively to each invention presently claimed.

The teaching regarding technical action disclosed with the present invention can be abstracted and combined with other examples.

The invention is explained in greater detail by the following examples and figures without wishing to restrict it thereby.

BRIEF DESCRIPTION OF THE FIGURES

FIG. 1 shows an electronic device (1) which comprises an electronically active material (2) inside its covering (7). The substrate (3), which is bonded to the sealing cap (4) via the adhesive (5), is located on the underside. The getter (6) here serves to scavenge ingressing oxygen.

FIG. 2 shows an electronic device (1) according to the invention in which an oxygen ion pump (8) is arranged in the adhesive (5). The adhesive here bonds the sealing cap (4) to the substrate (3). An electronically active element (2) is located on the substrate. The oxygen ion pump comprises the cathode (9) directed towards the interior of the covering (7) and the anode (11) directed towards the outside of the covering. The oxygen ion-conducting material (10) is located between the anode and the cathode. The electronic device according to the invention may optionally also comprise a getter (6).

FIG. 3 shows by way of example an oxygen ion pump as can be incorporated, for example, into an electronic device in accordance with FIG. 2. The cathode (9) and the anode (11) are located at the two opposite ends of the oxygen ion-conducting material (10).

FIG. 4 shows the diagrammatic view of the arrangement of an oxygen ion pump (8) which has been incorporated into an electronic device as layer on the substrate (3). The arrangement of the sealing cap (4) is intended to specify that the interior of the covering is located between sealing cap and substrate. The oxygen ion pump (8) is thus located on the inside surface of the substrate. The cathode (11) here is the first layer on the substrate, the oxygen ion-conducting layer (10) is the second layer and the anode (9) is the third layer facing the interior.

FIG. 5 shows a possible layer arrangement inside the covering on a substrate, in which the anode is intended to be connected to an oxygen-permeable sealing cap above the oxygen ion pump. The electronically active material here is preferably a light-emitting material which emits light on application of a voltage. The substrate here is preferably a light-transmitting substrate.

FIG. 6 likewise shows the possible arrangement of an oxygen ion pump in an electronic device, where the electrical potential of electrode 2 is lower than that of electrode 1 and is intended to release oxygen to the preferably oxygen-permeable substrate. The electronically active material is preferably a light-emitting material which emits light on application of a voltage. The substrate is preferably a light-transmitting substrate.

FIG. 7 shows a preparation scheme for an electronic device, where 101 is a glass substrate, 102 is an ITO bank for the anode contact, 103 is an ITO bank for the cathode contact, 201 is a 25×[YSZ] 101. glass substrate; 102. ITO bank for anode contact; 103. ITO bank for cathode contact; 201 a. 25×[YSZ1 nm/STO10 nm] supperlattice on 100 nm of STO and 301 is a Pt electrode. 401 stands for the following layer structure of an OLED: PEDOT/LEP/Ba/Al. 501 stands for UV-cured resin and 601 stands for the encapsulation by means of a glass cap

EXAMPLES

Example 1

Production of a Substrate Having an Oxygen Pump

An ITO-coated glass substrate, Sub1, (Technoprint Co. LTD.), measuring 30×30 mm, is used in the present invention. Sub1 is structured, with two ITO banks, one for anode contact (102) and another for cathode contact (103). The substrates are firstly cleaned in a clean room with deionised (DI) water and a detergent (Deconex 15 PF) and then activated by a UV/ozone plasma treatment.

Figure 1:
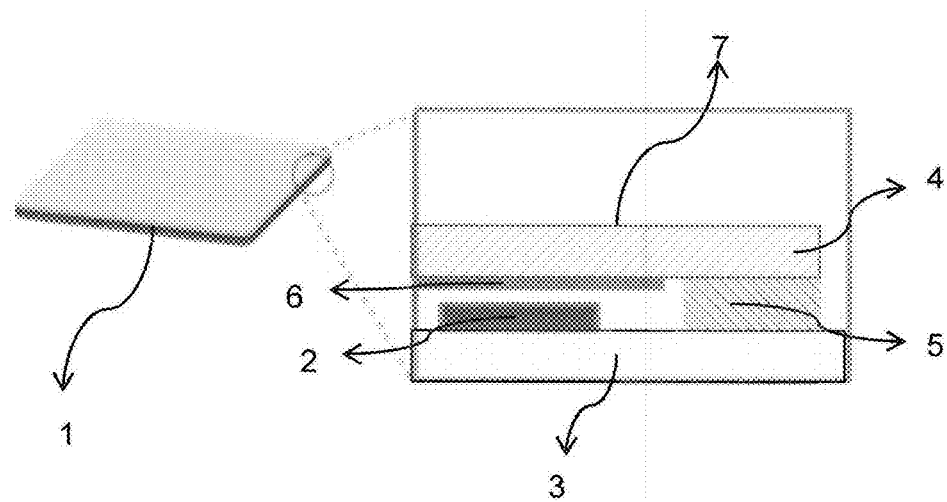
FIG. 1.
Figure 2:
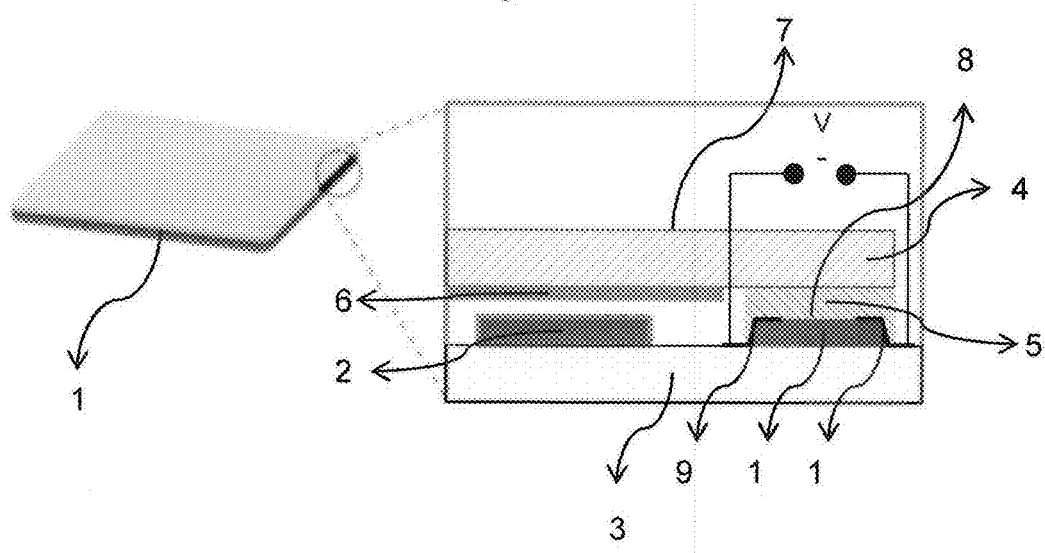
FIG. 2.
Figure 3:
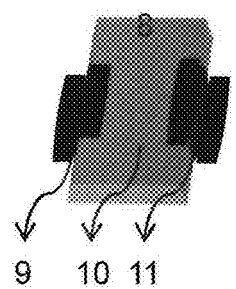
FIG. 3.
Figure 4:
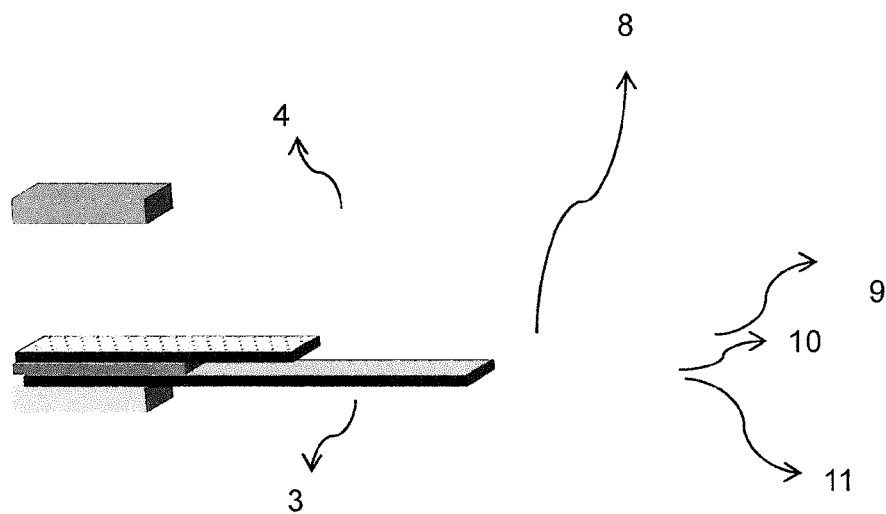
FIG. 4.
Figure 5:
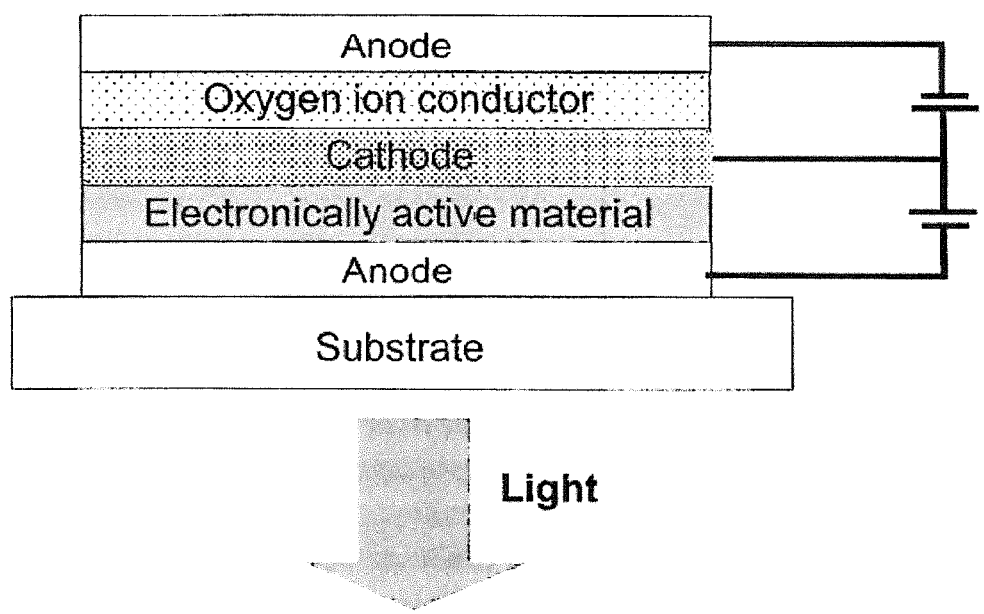
FIG. 5.
Figure 6:
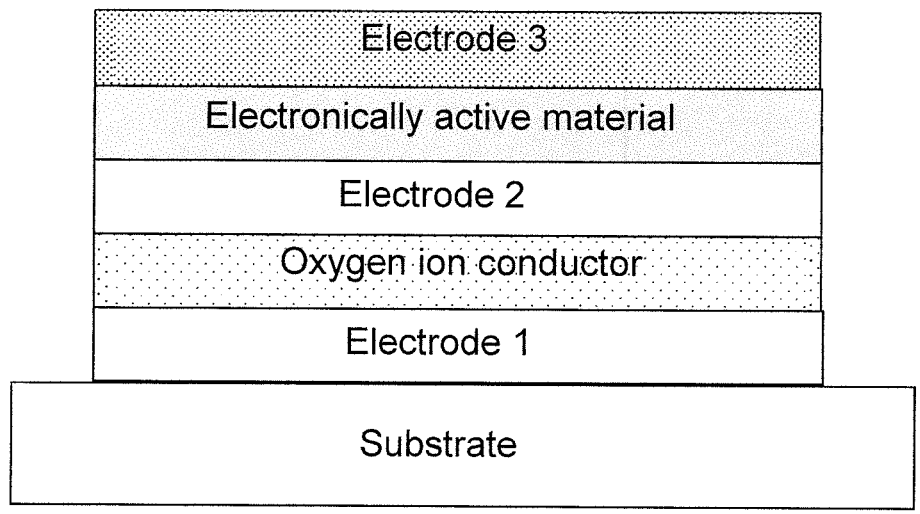
FIG. 6.
Figure 7:
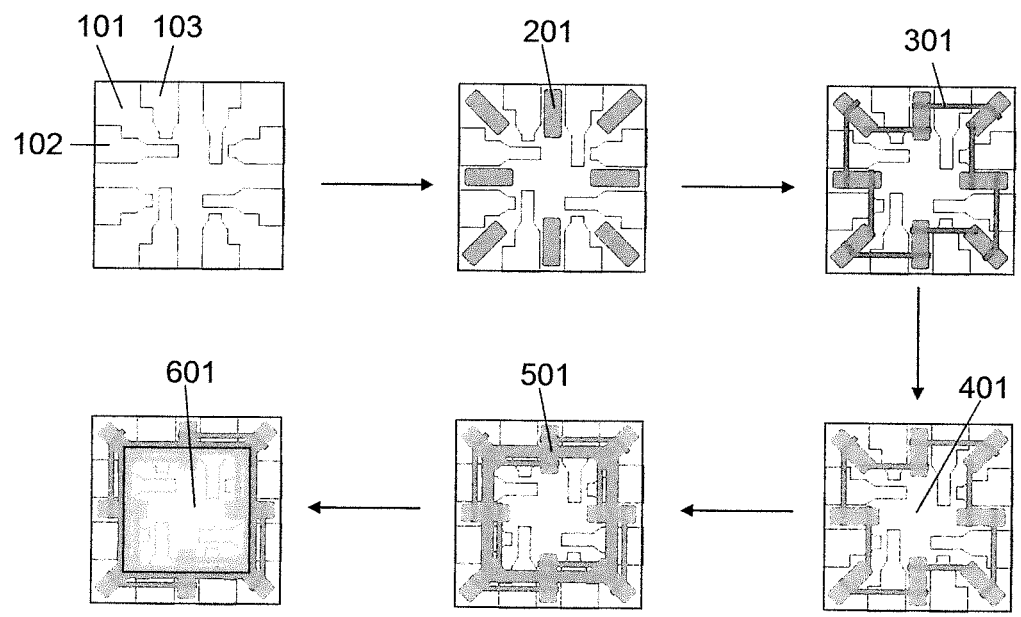
FIG. 7.

Production of an oxygen pump comprising a superlattice structure ((201) in FIG. 7): firstly, a 100 nm $SrTiO_3$ (STO) layer is applied to Sub1, and then 8 mol % of $(Y_2O_3)_x (ZrO_2)_{1-x}$ (YSZ) and $SrTiO_3$ (STO) layers are applied to STO in a high pressure (3 mbar) pure oxygen RF sputter system with Mask1. Mask1 corresponds to the 8 regions (201). High pressure and high substrate temperature (900° C.) enable slow (1 nm/min) and highly thermalised growth of complex oxides, which results in excellent film quality. The superlattices (201) having 25 recurring units of [$YSZ_{1nm}/STO_{10nm}$] are applied.

Pt electrodes (301) in the form of a mesh are subsequently deposited by RF sputtering using a shadow mask in order to achieve electrical contact between the electrodes.

The substrate obtained is called Sub2 in order to produce the device in accordance with the present invention.

Example 2

Production of PLEDs

PLED1 having the layer structure Sub1/ITO/HIL/LEP/cathode (comparison) and PLED2 having the layer structure Sub2/ITO/HIL/LEP/cathode (according to the invention) are produced by the following process, where ITO stands for an indium tin anode, HIL stands for hole-injection layer and LEP stands for light-emitting polymer.
1) PEDOT (CLEVIOS™ P VP Al 4083) is applied to the substrate as HIL having a thickness of 80 nm by spin coating and then heated at 180° C. for 10 minutes in a clean room;
2) an LEP (light emitting polymer) layer of 65 nm is applied by spin coating of a solution, SPB-02T (Merck KGaA) in toluene having a concentration of 0.5-1% by weight in an $N_2$ glove box;
3) the device is heated at 180° C. for 10 minutes in an $N_2$ glove box;
4) a Ba/Al cathode is applied by vapour deposition to the emitting layer having a thickness of 3 nm/150 nm in a vacuum of $10^{-6}$ torr;
5) the device is sealed in the $N_2$ glove box. For this purpose, use is made of a UV-curing resin, UV resin T-470/UR7114 (Nagase Chemtex Corporation) (501) in FIG. 7, and a glass cap (601), where the glass plate is smaller than the substrate in order to keep the contact pads unsealed (FIG. 7). The UV resin is firstly applied to the edge of the substrate. The cap is then located on the top. The device is then irradiated with UV light for 30 seconds. All steps are carried out in a glove box.

Example 3

Characterisation of PLED1 and PLED2

The PLED1 (comparison) and PLED2 (according to the invention) obtained in this way are characterised by standard methods. The following properties are measured here: UIL characteristics, electroluminescence spectrum, colour coordinates, efficiency, operating voltage and lifetime. The results are summarised in Table 1, where PLED1 serves as comparison in accordance with the prior art. In Table 1, $U_{on}$ stands for the turn-on voltage, and U(100) stands for the voltage at 100 cd/m². The lifetime is measured at constant current density with specific initial luminous density and is defined as the time at which the initial luminescence has dropped to half.

For PLED2, a negative voltage is applied to the inner Pt electrodes and a positive voltage is applied to the outer Pt electrodes during the measurement of the lifetimes, where the voltage is equal to the operating voltage of the PLED, so that $O_2$ is pumped out in the device.

TABLE 1

|  | Max. Eff. [Cd/A] | Uon [V] | U (100 cd/m²) [V] | CIE x | CIE y | Lifetime [hrs] | Initial Luminance [cd/m²] |
|---|---|---|---|---|---|---|---|
| PLED1 | 4.70 | 2.55 | 3.35 | 0.15 | 0.22 | 29 | 798 |
| PLED2 | 4.86 | 2.57 | 3.34 | 0.16 | 0.22 | 49 | 830 |

As can be seen from Table 1, the two PLEDs exhibit very similar properties, where PLED2 has a lifetime which is almost 1.7 times longer than that of PLED1.

Further improvements or optimisations in the OLEDs can be achieved by various approaches without inventive step. Thus, other emitting materials, other layer structures, etc., can be used.

The use of the oxygen pump, as described in the present invention, can readily also be applied to other organic electronic devices, for example to OPV, OFET etc.

The invention claimed is:

1. Electronic device which comprises at least one electronically active material, a covering which encloses the electronically active material in its interior, and an oxygen ion pump, where the oxygen ion pump is either an integral constituent of the covering or is installed on the inside surface of the covering, and where the oxygen ion pump comprises a cathode and an anode at two opposite ends of an oxygen ion-conducting material, where at least part of the cathode is directed towards the inside of the covering and at least part of the anode is directed towards the outside of the covering, in which the covering comprises a substrate and a sealing cap and an adhesive, where the adhesive seals the substrate and the sealing cap to one another, and in which the oxygen ion pump is arranged in the region of the adhesive.

2. Electronic device according to claim 1, in which the oxygen ion pump is arranged as a layer at least in regions on the substrate and/or the sealing cap.

3. Electronic device according to claim 2, in which the region of the substrate and/or of the sealing cap on which the oxygen ion pump is installed is oxygen-permeable.

4. Electronic device according to claim 1, in which the substrate and/or the sealing cap consists of glass, ceramic, a polymer layer or plastic.

5. Electronic device according to claim 1, in which the oxygen ion-conducting material is a solid-state electrolyte.

6. Electronic device according to claim 5, in which the solid-state electrolyte is selected from the group consisting of yttrium-stabilised zirconium oxide, ytterbium-stabilised zirconium oxide, calcium-stabilised zirconium oxide, cerium-stabilised zirconium oxide, ytterbium-stabilised zirconium oxide, scandium-stabilised zirconium oxide, titanium oxide, tin oxide, zinc oxide and combinations thereof.

7. Electronic device according to claim 1, in which the cathode comprises a material which is selected from the group of the noble metals, preferably Pt or Pd, very preferably the cathode is in the form of a gas-permeable metal mesh.

8. Electronic device according to claim 1, in which the electronically active material is an oxygen-sensitive material.

9. Electronic device according to claim 1, in which the electronically active material is an organic electronic material or a material containing at least one quantum dot.

10. Electronic device according to claim 9, in which the organic electronic material is a light-emitting material.

11. Use of an oxygen ion pump, according to claim 1 for the removal of oxygen from an electronic device.

12. Electronic device according to claim 1 or use according to claim 11, in which the electronic device is selected from the group consisting of organic or polymeric organic electroluminescent devices (OLED, PLED), organic field-effect transistors (OFETs), organic integrated circuits (OICs), organic thin-film transistors (OTFTs), organic light-emitting transistors (OLETs), organic solar cells (OSCs), organic optical detectors, organic laser diodes (O-lasers), organic field-quench devices (OFQDs), light-emitting electrochemical cells (LECs), "organic plasmon emitting devices" and organic photovoltaic (OPV) elements or devices, and organic photoreceptors (OPCs).

* * * * *